United States Patent [19]

Sundby

[11] Patent Number: 5,371,419
[45] Date of Patent: Dec. 6, 1994

[54] CMOS WELL SWITCHING CIRCUIT

[75] Inventor: James T. Sundby, Tracy, Calif.

[73] Assignee: Mitsubishi Denki Kabushiki Kaisha, Tokyo, Japan

[21] Appl. No.: 980,002

[22] Filed: Nov. 23, 1992

[51] Int. Cl.$^5$ ............... H03K 3/01; H03K 17/687; H03K 19/094; H01L 25/00
[52] U.S. Cl. ............... 327/543; 327/546; 327/541; 327/389; 327/434; 326/112
[58] Field of Search ............... 307/296.1, 296.8, 303.1, 307/303.2, 304, 571, 573, 585, 450, 443, 451, 296.5, 296.6

[56] References Cited

U.S. PATENT DOCUMENTS

| | | | |
|---|---|---|---|
| 4,752,700 | 6/1988 | Boyacigiller | 307/296.8 |
| 4,791,318 | 12/1988 | Lewis et al. | 307/296.8 |
| 4,837,460 | 6/1989 | Uchida | 307/296.8 |
| 5,157,281 | 10/1992 | Santin et al. | 307/296.8 |

Primary Examiner—Timothy P. Callahan
Assistant Examiner—Trong Phan
Attorney, Agent, or Firm—Townsend and Townsend Khourie and Crew

[57] ABSTRACT

A circuit for switching the well in a CMOS circuit to one of two power supply rails. In, for example, an N-well CMOS process, when an output is driven by a PMOS pull-up transistor, the P+ (drain of the PMOS) to N-well junction may be forward biased if the rail drops to ground. This will cause the output to be pulled to ground. The switching circuit of the present invention avoids the grounding of the output by automatically switching the N-well to the higher power supply rail so that grounding the rail would not cause the output to fall. MOS switches connect the well to either of the power supplies. Therefore, there is no voltage drop from the power supply to the well as in the case of switching circuits using diodes. Also, this circuit connects the well to the highest power supply regardless of which power supply drops to ground. Therefore, it does not require one power supply to be always on for proper operation. A similar P-well design of the switching circuit would provide the same protection for an output drive circuit with an NMOS pull-down transistor.

9 Claims, 5 Drawing Sheets

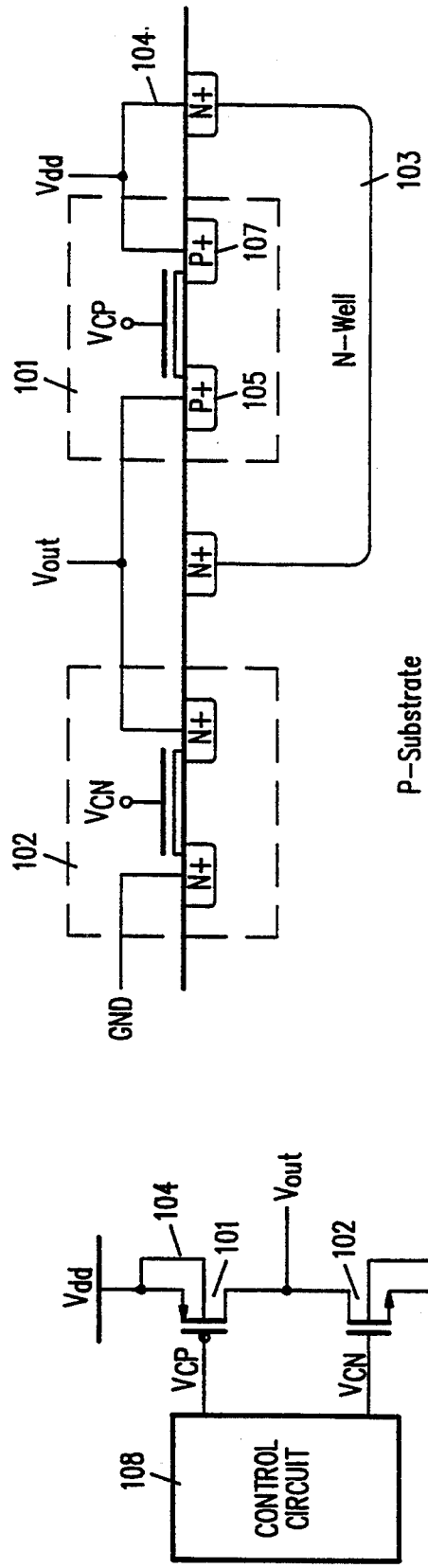
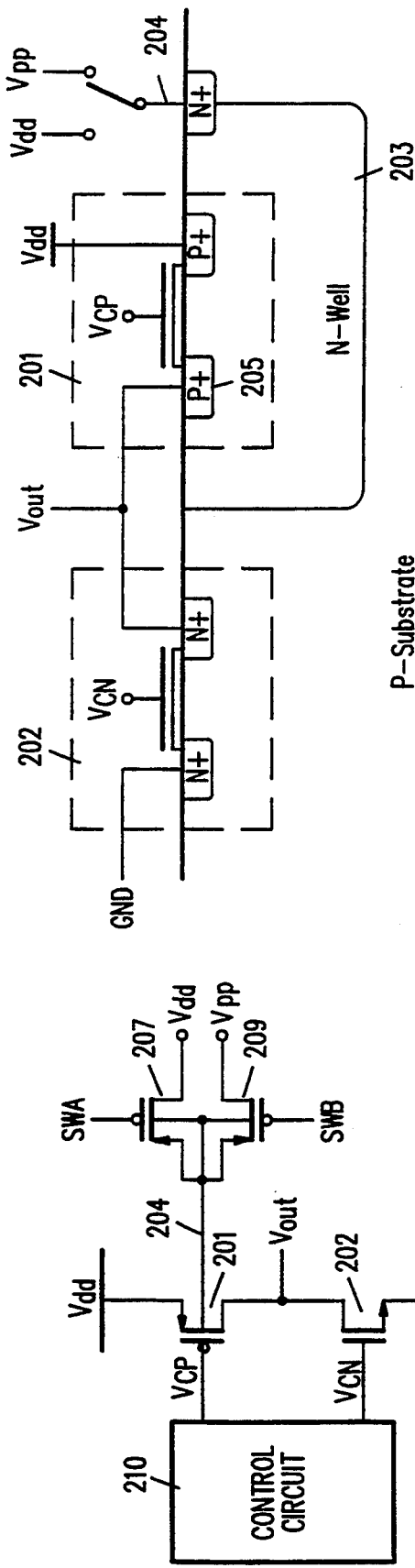
FIG. 1B
FIG. 2B
FIG. 1A
FIG. 2A

CMOS WELL SWITCHING CIRCUIT

BACKGROUND OF THE INVENTION

Integrated circuits generally run off of a ground terminal and a power supply rail or a positive and a negative power supply rail. In some circuits, in addition to a ground terminal, two separate power supply rails are required. For instance, a chip that includes both digital and analog circuitry may require a separate power supply to avoid introducing noise from the digital into the analog circuitry. Also in many cases, the analog circuitry requires a different voltage level than the digital circuitry.

In CMOS circuits that have two power supplies at different voltages, the grounding of one of the power supplies to which an output driver circuit is connected may cause the grounding of the output signal. This can occur, for example, in an N-well CMOS process, where an output driver has a p-channel pull-up transistor at the output. If the power supply rail to which the source and N-well terminals of the pull-up transistor is connected were grounded, the P+ (drain terminal of the pull-up transistor) to N-well junction would be forward biased causing the output to fall to ground.

This can be avoided if the N-well in which the p-channel pull-up transistor resides is connected to the highest potential. In that case, grounding the rail would not cause the output to fall below the value of the highest power supply voltage. However, when the voltage levels of the power supplies are not fixed (and it is not known which supply is highest), the well can not be hardwired to one of the rails. It is therefore necessary to switch the potential of the well to that one of the rails which at any given time is at the highest potential.

Existing circuits addressing this problem have utilized diodes to connect the well to the highest potential, or switches that are digitally controlled by separate logic circuits. These approaches have certain drawbacks. When diodes are used, the cathode terminals connect together and to the well, while each anode terminal connects to a separate power supply rail. This way the diode connected to the highest potential will be forward biased while others would be reversed biased. With this approach, the potential at the well will always be a diode drop below the power supply rail and the diode would be on the verge of conducting current. Beside the lowering of the voltage by one diode drop, this circuit may cause latch-up problems. The approach using digitally controlled switches requires additional circuitry which must be powered on at all times to generate the correct control signals. This approach is therefore not flexible in situations where either power supply may be grounded.

SUMMARY OF THE INVENTION

The CMOS well switching circuit of the present invention automatically connects the well of an output transistor to either the highest potential (in the case of a p-channel pull-up transistor in an N-well CMOS process with two variable positive supplies) or the lowest potential (in the case of an n-channel pull-down transistor in a P-well CMOS process with two variable negative supplies).

The present invention provides, in a complementary metal-oxide-semiconductor (CMOS) circuit having two variable power supply terminals and a fixed supply (or ground) terminal, a switching circuit for switching a well in the CMOS circuit to one of the two variable power supply terminals comprising: switch control circuit means, having two inputs coupled to the first and second variable power supply terminals, respectively, for comparing a voltage level at the first variable power supply terminal to a voltage level at the second variable power supply terminal; and switch circuit means, coupled between the well of the CMOS circuit, the first variable power supply and the second variable power supply, and having two control terminals coupled to two switch control circuit means outputs, for coupling the well of the CMOS circuit to the one of the two variable power supply terminals having a higher voltage level in absolute magnitude in response to the two switch control means outputs.

In an N-well process, for example, the CMOS well switching circuit of the present invention connects the well to the highest rail through an MOS transistor switch. Therefore, the well and the highest power supply rail are always at the same potential.

Furthermore, the circuit does not require logic circuitry that must be powered on at all times. Therefore, regardless of which power supply rail drops to ground, the automatic switching circuit turns on the right switches.

In one embodiment of the present invention, the switch control circuit means of the switching circuit of the present invention comprises comparator means coupled between the first variable power supply terminal and the fixed supply, having two inputs coupled to the two variable power supply terminals, and having two complementary outputs, with a true output coupled to an output of the switch control circuit means, the comparator means for comparing a voltage level at the two power supply terminals; and voltage level detector means, coupled between the second variable power supply terminal and the fixed supply, having an input coupled to the first variable power supply terminal, for detecting a voltage level at the first variable power supply terminal and overriding the comparator means complementary outputs and forcing the outputs of the switch control circuit to couple the well to the second variable power supply terminal, when the voltage level at the first variable power supply terminal falls below a minimum level in absolute magnitude.

A further understanding of the present invention may be had with reference to the description and diagrams below.

BRIEF DESCRIPTION OF THE DRAWINGS

1. FIGS. 1A and 1B show a typical N-well CMOS output circuit with a p-channel pull-up transistor, and the corresponding silicon cross section;

2. FIGS. 2A and 2B show a CMOS output circuit with an N- well terminal of a p-channel pull-up transistor switchable to one of two power supply rails, and the corresponding silicon cross section;

DESCRIPTION OF THE PREFERRED EMBODIMENT

Figure 3:
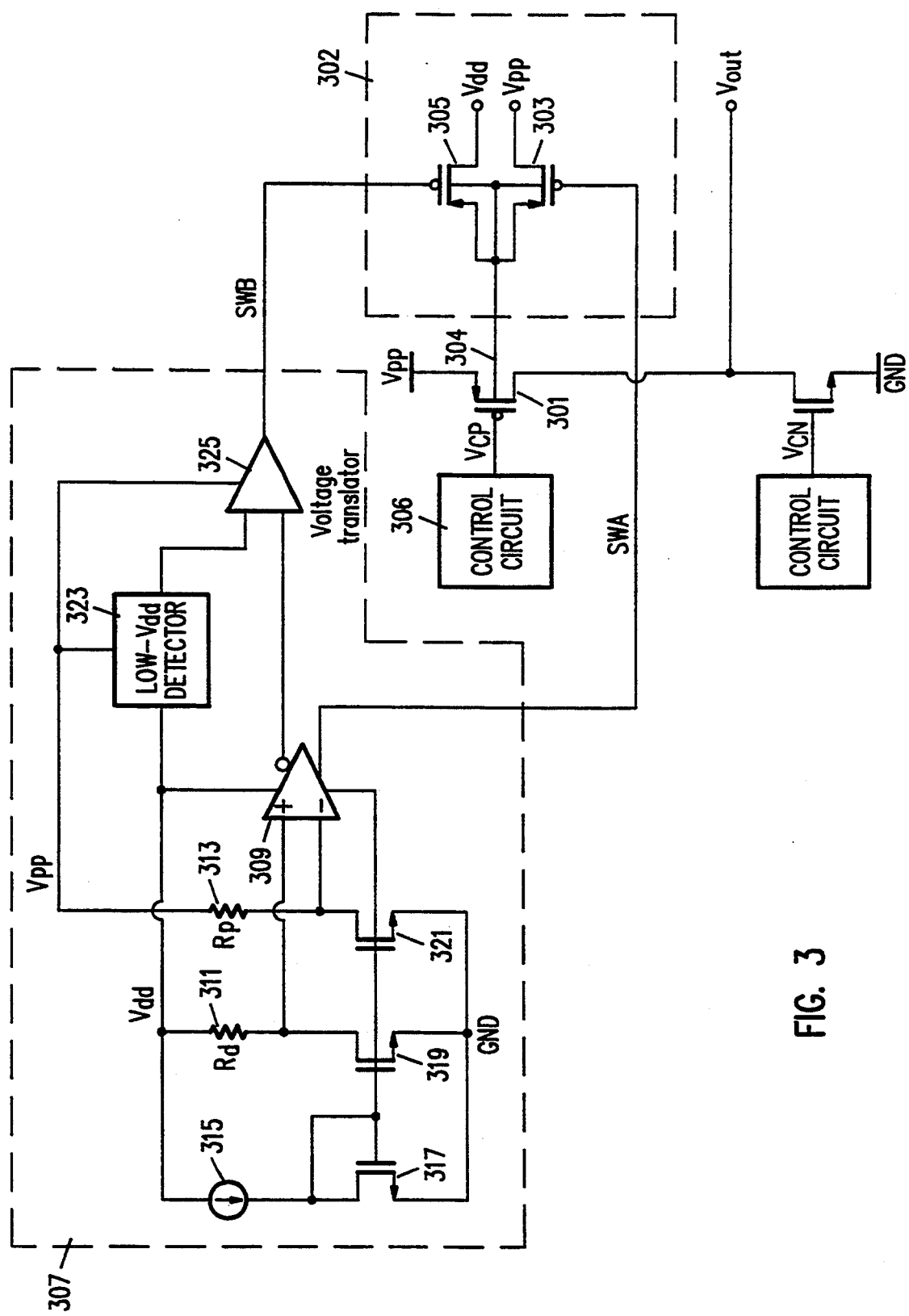
FIG. 3 is a simplified block diagram of one embodiment of the CMOS well switching circuit of the present invention.

FIGS. 1A and 1B show a typical output drive circuit with a p-channel pull-up transistor 101 and an n-channel pull-down transistor 102, and a corresponding silicon cross section. The power supply terminal Vdd may have a changing voltage level with respect to ground, and is therefore referred to as the variable power supply. For proper operation of the output drive circuit, the P-N junctions formed by the two P+ source/drain regions 107, 105 of PMOS 101 and N-well 103 must remain reverse biased. This is typically accomplished by connecting the N-well terminal 104 of PMOS 101 to the positive power supply Vdd. However, this does not guarantee against the forward biasing of the P+ 105 to N-well 103 junction. As can be seen from the cross section in FIG. 1B, if the voltage at Vdd drops down to ground the potential of the N-well 103 is also pulled to ground. If the gate terminals of the transistors 101 and 102 are biased by the control circuit 108 such that the output voltage at Vout is high (e.g. 5 volts), the P+ 105 to N-well 103 junction will be forward biased. This will cause the potential at Vout to drop down to one diode drop above ground.

To avoid this problem, instead of hardwiring the N-well terminal 104 to Vdd, the connection can be made switchable to a higher voltage if one is available. With the N-well at a higher potential, the junction will either remain reversed biased or if forward biased Vout will be at most lowered to one diode drop above the higher voltage.

FIGS. 2A and 2B show a PMOS pull-up transistor 201 with a switchable N-well terminal 204, and it's corresponding silicon cross section, in a circuit that has two variable power supplies Vdd and Vpp. In this circuit, if Vdd drops down to ground, the N-well terminal 204 will be switched to Vpp by turning on switch transistor 209. If the voltage at Vpp is higher than Vout, then the P+ 205 to N-well 203 junction will remain reversed biased and Vout will not be affected. If the voltage at Vpp is lower than Vout, the output voltage at Vout will drop, but only to Vpp plus the turn on voltage of the junction. Therefore, Vout will never drop down to ground. The switching of the N-well terminal 204 is implemented by two transistors 207 and 209 that are controlled by signals SWA and SWB. The operation of the control circuit that generates signals SWA and SWB will be described in connection with FIGS. 3 and 4. This method would also work for a P-well CMOS process with an n-channel pull-down that required the potential at it's P-well to be switched to the lowest of two power supplies.

FIG. 3 is a simplified block diagram of one embodiment of the present invention in an N-well CMOS process. Transistor 301 is a p-channel pull-up transistor with a source terminal connecting to Vpp and a drain terminal connecting to Vout. The gate terminal of output transistor 301 connects to a driver circuit (not shown) and is driven high and low at different times. Transistor 301 resides in an N-well region with a terminal 304 connecting to two switch transistors 303 and 305. The switch transistors 303 and 305 connect the N-well terminal 304 to Vpp and Vdd, respectively. Two outputs of a switch control circuit 307, SWA and SWB, control the gate terminals of switch transistors 303 and 305, respectively.

Switch control circuit 307 controls switching circuit 302, and includes a comparator 309 that runs between Vdd and ground. The two power supplies Vdd and Vpp connect to the negative and positive inputs of comparator 309 via level shift resistors Rd 311 and Rp 313 respectively. Current source 315, diode connected transistor 317, and transistors 319 and 321 provide the biasing current for comparator 309 and resistors Rd 311 and Rp 313. A low-Vdd detector 323 that runs between Vpp and ground, receives Vdd at its input. An inverted output of comparator 309 and an output of the low-Vdd detector 323 connect to two inputs of a voltage translator 325. Voltage translator 325 runs between Vpp and ground. An output of voltage translator 325 and a true output of comparator 309 form the two switch control circuit 307 outputs, SWB and SWA, respectively.

SWA, which is the true output of comparator 309, controls the gate of switch transistor 303. Therefore, when Vdd is higher than Vpp, SWA is high, turning off the p-channel switch transistor 303. The inverted output of comparator 309 controls the gate of switch transistor 305 through voltage translator 325. Therefore, SWB is low, turning on p-channel switch transistor 305. With the switch transistors so controlled, the N-well terminal 304 of pull-Up transistor 301 is switched to Vdd which is the higher of the two.

When Vpp is higher than Vdd, SWA (or the true output of comparator 309) is low, turning on switch transistor 303. The inverted output of comparator 309, which is high, turns switch transistor 305 off through voltage translator 325. This time, the switches as controlled, connect the N-well terminal 304 of pull-up transistor 301 to Vpp which is the higher of the two.

If Vdd drops so low that comparator 309 and the bias circuitry can not function properly, low-Vdd detector 323 forces the output of voltage translator 325 (SWB) high, turning off switch transistor 305. At the same time, SWA can not be more than one diode drop above Vdd. This way, with SWA low and SWB high, the N-well terminal 304 will connect to Vpp as desired.

Figure 4A:
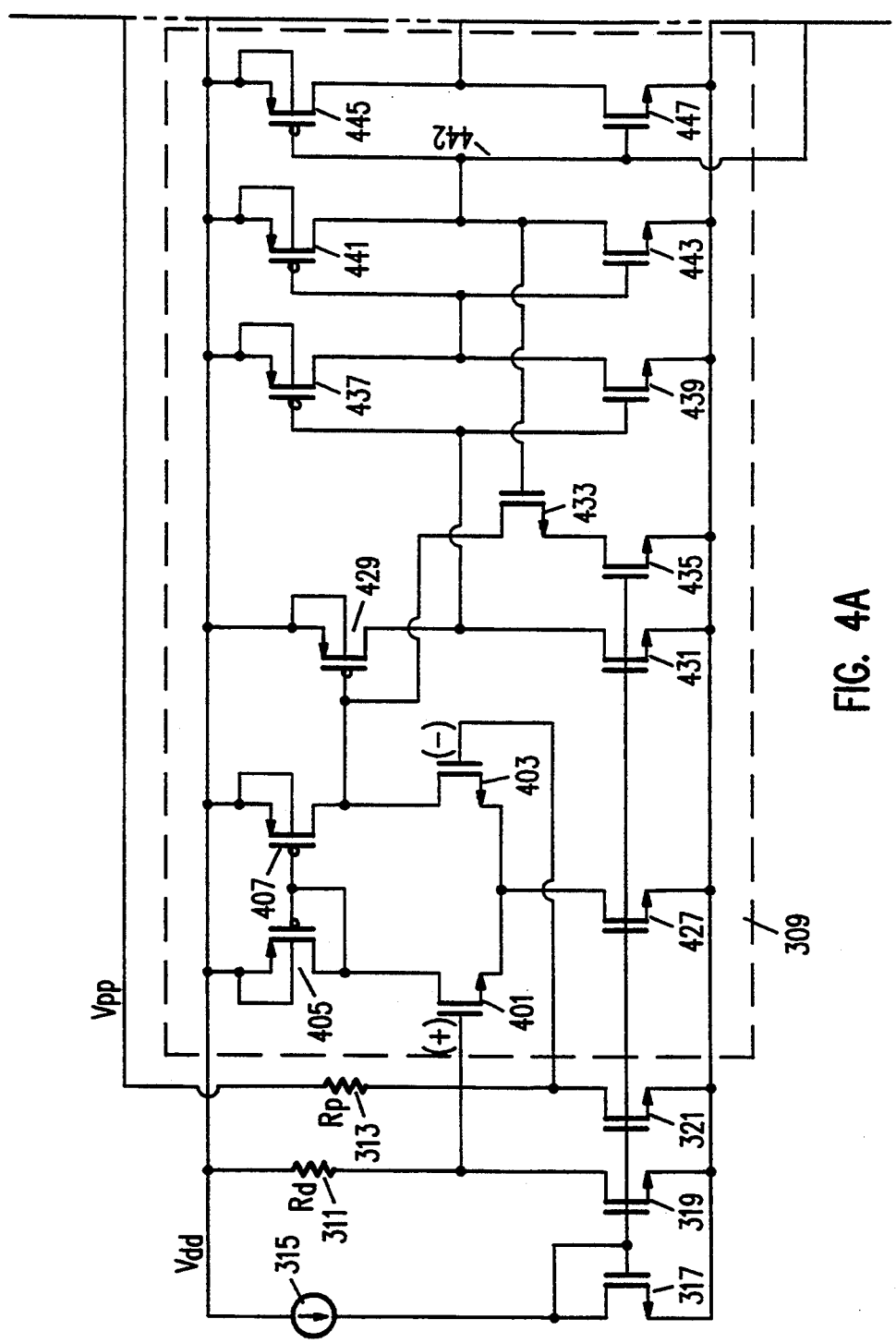
FIG. 4 is a transistor level circuit diagram of the simplified block diagram of FIG. 3; and 5.
Figure 4B:
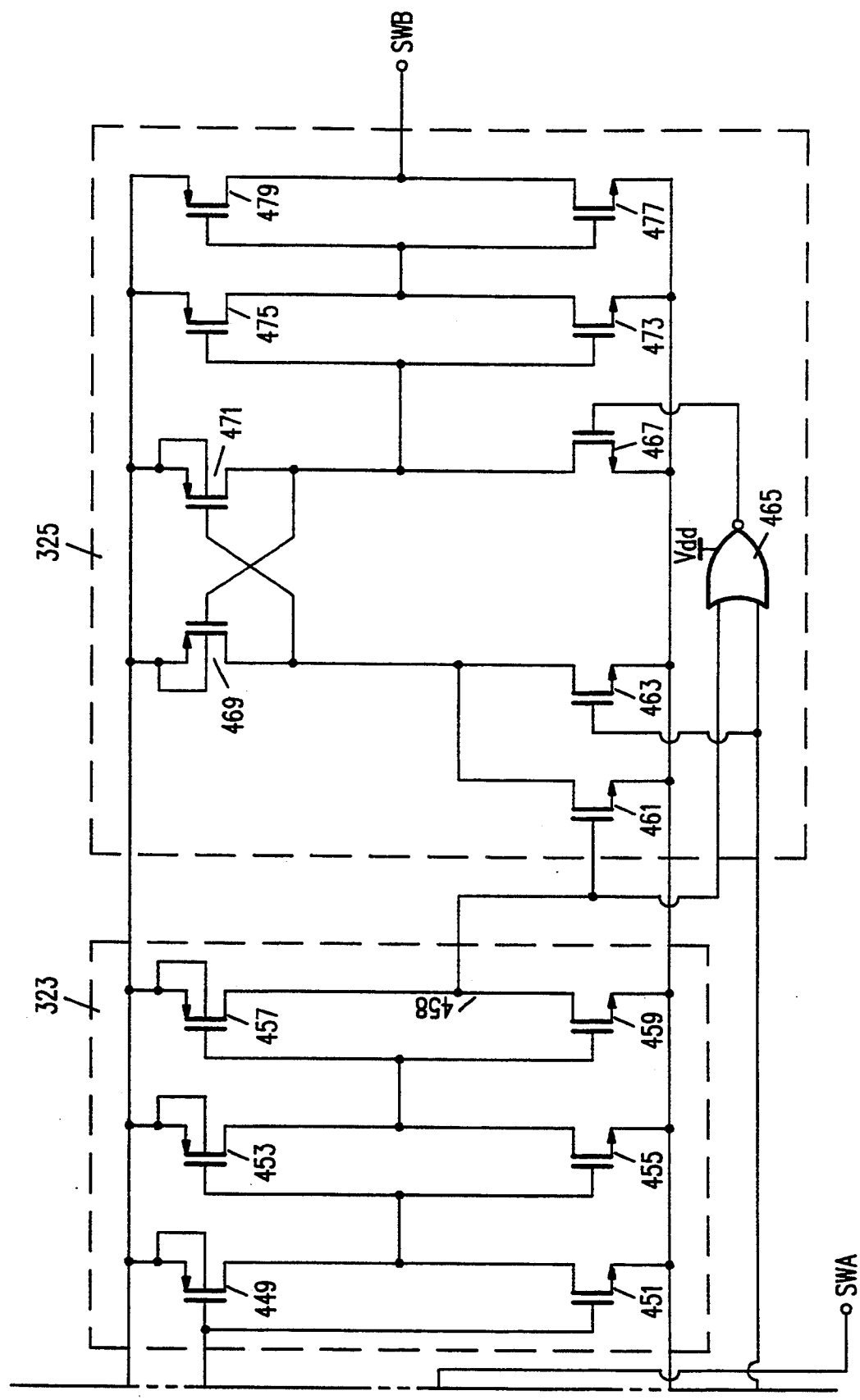

FIG. 4 is a transistor level circuit diagram of the switch control circuit 307 in FIG. 3. Transistors 401, 403, 405, 407, and 427 constitute a differential pair input stage for comparator 309 that is powered by Vdd. NMOS transistors 401 and 403 are the input devices with their source terminals connected together and their gate terminals forming the positive and the negative input terminals of comparator 309 respectively. PMOS transistors 405 and 407 connect between Vdd and the drain terminals of input transistors 401 and 403 respectively, as load devices. NMOS transistor 427 connects to the common source of the two input transistors 401 and 403 as the current source for the differential pair. The output stage of comparator 309 includes a PMOS inverter transistor 429 connecting to an NMOS current source 431. The gate of transistor 429 connects to the common drains of input and-load transistors 403 and 407. The common drain of the output stage transistors 429, 431 connect to an input of a buffer that is formed by three inverters connected in series. Transistor pairs 437, 439, and 441, 443, and 445, 447 connected between Vdd and ground, form the PMOS, NMOS pair of each of the three inverters. The output of the last inverter (drain terminals of transistor pair 445, 447) is the true output of comparator 309 and connects to SWA, and the output of the second inverter (drain terminals of transistor pair 441, 443) is the inverted output of comparator 309. To help provide a stable trip point for comparator 309, NMOS transistors 433, and 435 provide a few millivolts of hysteresis. The drain of transistor 433 connects to the gate of output stage inverter transistor 429, while the gate of transistor 433 connects to the output of the second inverter (transistor pair 441, 443) of the buffer. The source terminal of transistor 433 connects to a drain of current source transistor 435.

Power supply rails Vpp and Vdd respectively connect to negative and positive inputs of comparator 309 through level shift resistors Rp 313 and Rd 311. The biasing for this circuit is set up by current source 315 that is connected between Vdd and the diode connected NMOS transistor 317. The drain and gate of transistor 317 connect to gates of two current source transistors 319 and 321 biasing the two level shift resistors Rp 313 and Rd 311. The drain and gate of transistor 317 also connect to gate terminals of the three current source transistors 427, 431, and 435 of comparator 309 to properly bias comparator 309.

Three inverters in series and connected between Vpp and ground form the low-Vdd detector 323. Transistor pairs 449, 451, and 453, 455, and 457, 459 form the PMOS, NMOS pair of each inverter. The input of the first inverter (gate terminals of transistor pair 449, 451) connects to Vdd, and the output 458 of the last inverter (drain terminals of transistor pair 457, 459) connects to the output of low-Vdd detector 323.

The input stage of voltage translator 325 is a latch circuit. Two NMOS input transistors 461 and 463 receive the output 458 of low-Vdd detector 323 and the inverted output 442 of comparator 309 at their gate terminals respectively. The two signals, 458 and 442, connect respectively to the inputs of a two-input NOR gate 465 that runs off of Vdd. The output of NOR 465 connects to the gate terminal of a third NMOS transistor 467. The drain terminals of input transistors 461 and 463 connect together, and the source terminals of all three NMOS transistors 461, 463, and 467 connect to ground. The drain terminals of a cross-coupled pair of PMOS transistors 469 and 471 connect to the common drain of transistors 461 and 463, and drain of transistor 467 respectively. The cross coupling is formed by connecting the gate of transistor 471 to the common drain of transistors 461, 463, and 469, and connecting the gate of transistor 469 to the common drain of transistors 471 and 467 which is the output of the latch. Two buffer inverters, connected in series, follow the latch circuit. Transistor pairs 475, 473, and 479, 477 form the PMOS, NMOS pair of each inverter. The output of the latch connects to the input of the first inverter (gate terminals of transistor pair 475, 473). The output of the buffer (drain terminals of transistor pair 479, 477) is the output of the voltage translator 325 which connects to SWB.

As discussed above in connection with the operation of the simplified block diagram of FIG. 3, when the voltage at Vdd is higher than the voltage at Vpp, SWA is high and SWB is low to switch the N-well terminal 304 to Vdd. Comparator 309 is a conventional two stage differential pair comparator and operates accordingly. Therefore, the true output of comparator 309, which connects to SWA, will be high when the potential at it's positive input (i.e. Vdd) is higher than the potential at it's negative input (i.e. Vpp). The inverted output 442, which is low, feeds the gate of voltage translator 325 latch input transistor 463 as well as one input of the two-input NOR 465. Since Vdd is higher than Vpp, the output 458 of the three inverters of the low-Vdd detector 323 is low. This output 458 feeds the gate of the second input transistor 461 of the voltage translator 325 latch, and the second input of the two-input NOR 465. Since the two inputs to NOR 467 are low, it's output, which feeds the gate of the third NMOS transistor 467 of the latch, is high. This turns the latch output low. This low voltage at the latch output is inverted twice by the two voltage translator 325 buffer inverters. Therefore SWB turns low.

When Vdd is lower than Vpp, the voltage at the negative input of comparator 309 is higher than the voltage at it's positive input. Therefore this time, SWA, which is connected to the true output of comparator 309, turns low. If Vdd is far enough below Vpp, the output of the first inverter in the low-Vdd detector 323 inverter series goes high up to Vpp. Therefore, the output of the low-Vdd detector 323 (after two inversions) turns high. With either, the output of low-Vdd detector 323 and/or the inverted output of comparator 309 high, the two NMOS input transistors 461 and 463 of the voltage translator 325 turn on, pulling the voltage at their common drain terminal down to ground. This turns on PMOS transistor 471, pulling up the latch output to Vpp. At the same time, the output of NOR 465 turns low, which in turn causes transistor 467 to turn off. Therefore, the output of the latch turns high and after two inverters, SWB turns high.

Because comparator 309 and the current source 315 are powered by Vdd, if Vdd drops to a low enough voltage, comparator 309 will cease to operate properly. In this situation both the true and the inverted outputs of comparator 309 will be low. Therefore, SWA is low. Since Vdd is low, the output of low-Vdd detector 323 will be at Vpp (high). This will turn on input transistor 461 of voltage translator 325 latch, pulling down the gate of transistor 471. At the same time, with one input of NOR 465 high, it's output turns low, turning off transistor 467. Therefore, the output of the latch turns high which in turn causes SWB to turn high. The grounding of Vdd, therefore, will not adversely affect the operation of the well switching circuit.

Figure 5A:
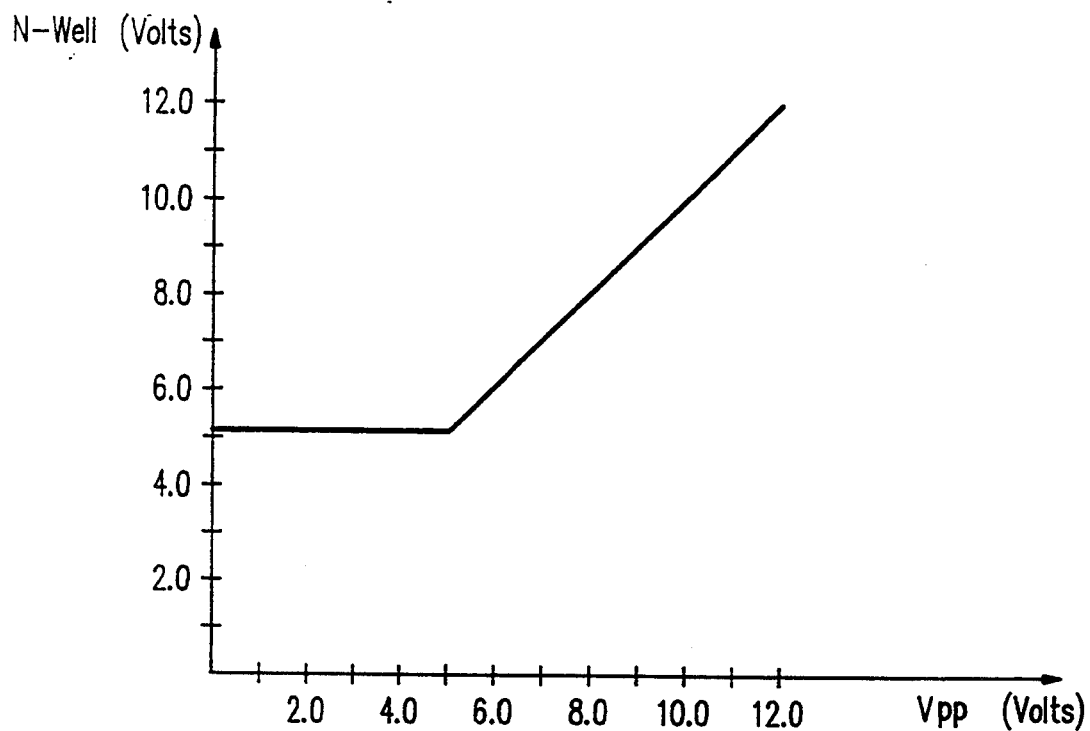
FIGS. 5A and 5B are voltage diagrams showing the voltage at the drain of a p-channel pull-up transistor in response to varying voltages at power supply terminals, illustrating the operation of circuit of FIG. 4.
Figure 5B:
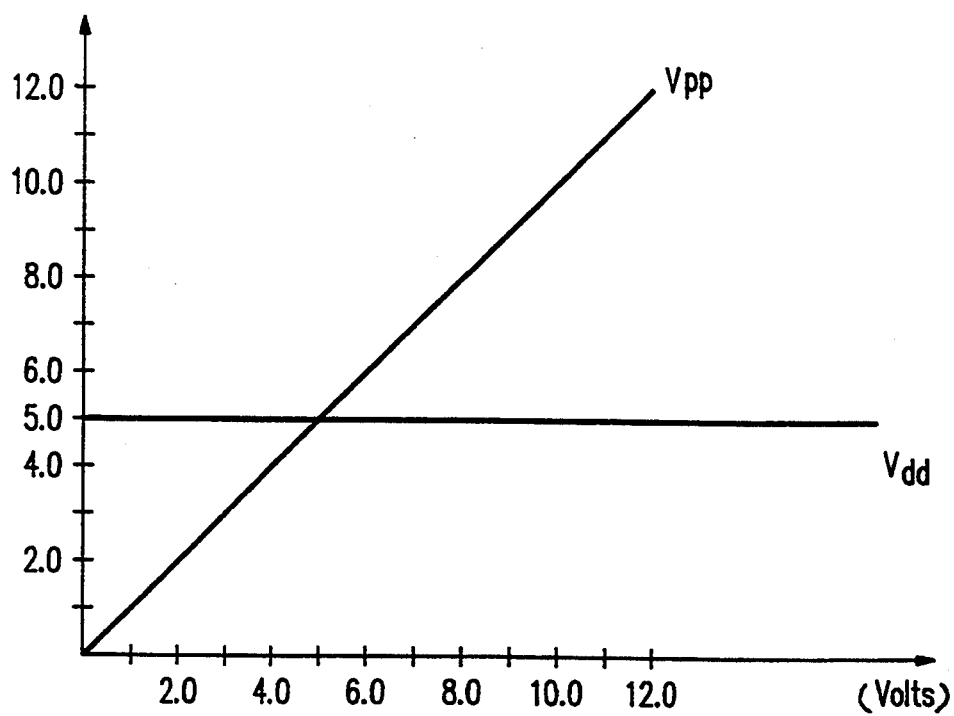

FIG. 5A is a voltage diagram of the potential at the N-well terminal 304 of the PMOS pull-up transistor 301 of FIG. 3 (Vout), illustrating the operation of an N-well switching circuit. As shown in FIG. 5B, Vdd is held at a fixed voltage (5 volts) while Vpp varies from 12 volts to ground. As Vpp drops, the voltage at the N-well of transistor 301 follows Vpp. When Vpp drops below Vdd, the outputs of the switch control circuit (SWA and SWB) change states and the N-well terminal 304 of the PMOS pull-up transistor 301 switches to Vdd. This ensures that Vpp can no longer pull the drain of PMOS 301 down below the turn on voltage of the junction plus the fixed voltage at Vdd. In conclusion, the present invention offers an efficient and flexible CMOS well switching circuit. While the above is a complete description of the preferred embodiment of the present invention, it is possible to use various alternatives, modifications and equivalents. For example, a P-well CMOS version of this circuit may be designed for switching a P-well of an NMOS pull-down transistor in an output driver circuit to the lowest of two variable power supplies. Therefore, the scope of the present invention should be determined not with reference to the above description but should, instead, be determined with reference to the appended claims, along with their full scope of equivalents.

What is claimed is:

1. In a complementary metal-oxide-semiconductor (CMOS) circuit coupled between a first and a second variable power supply terminal and a fixed supply terminal, and fabricated in a CMOS process having a well region within a silicon substrate, a switching circuit for switching a potential of the well in the CMOS circuit to the first or the second variable power supply terminal comprising:

switch control circuit means, having inputs coupled to the first and second variable power supply terminals, respectively, and having a first and a second output, said control circuit means for comparing a voltage level at the first variable power supply terminal to a voltage level at the second variable power supply terminal; and switch circuit means, coupled between a well terminal of the CMOS circuit, the first variable power supply and the second variable power supply, and having two control terminals coupled to said first and second switch control circuit means outputs, respectively, for coupling the well terminal of the CMOS circuit to the one of the two variable power supply terminals having a higher voltage level in absolute magnitude in response to said first and second control circuit means outputs.

2. The switching circuit of claim 1 wherein said switch control circuit means further comprises:

comparator means coupled between the first variable power supply terminal and the fixed supply, having a first and a second input coupled to the first and the second variable power supply terminals, respectively, and having a first and a second output, with said first output coupled to said first switch control circuit means output, said comparator means for comparing a voltage level at the first and the second power supply terminals; and voltage level detector means, coupled between the second variable power supply terminal and the fixed supply, having an input coupled to the first variable power supply terminal, for detecting a voltage level at the first variable power supply terminal and overriding said comparator means first and second outputs, and forcing said switch control circuit means outputs to couple a well terminal of the CMOS circuit to the second variable power supply output, when said voltage level at the first variable power supply terminal falls below a minimum level in absolute magnitude.

3. The switching circuit of claim 1 wherein said switch control circuit means further comprises:

a comparator coupled between the first variable power supply and the fixed supply, having a first and a second input and a first and a second output, with said first output coupled to said first switch control circuit means output;

a first level shift resistor coupling said first comparator input to the first variable power supply terminal;

a second level shift resistor coupling said second comparator input to the second variable power supply terminal;

a voltage level detector coupled between the second variable power supply terminal and the fixed supply terminal, having an input and an output, with said input coupled to the first variable power supply terminal; and a voltage translator coupled between the second variable power supply terminal and the fixed supply terminal, having a first input coupled to said second comparator output, a second input coupled to said voltage level detector output, and an output coupled to said second switch control circuit output.

4. The switching circuit of claim 1 wherein said switch circuit means further comprises:

a first transistor switch having a first terminal coupled to a well terminal of the CMOS circuit, a second terminal coupled to the first variable power supply terminal, and a gate terminal coupled to said switch control circuit first output; and a second transistor switch having a first terminal coupled to the well terminal of the CMOS circuit, a second terminal coupled to the second variable power supply terminal, and a gate terminal coupled to said switch control circuit second output.

5. In a complementary metal-oxide-semiconductor (CMOS) circuit coupled between a first and a second variable power supply terminal and a fixed supply terminal, a switching circuit comprising:

a comparator coupled between the first variable power supply and the fixed supply, having a first and a second input and a first and a second output;

a first level shift resistor coupling said first comparator input to the first variable power supply terminal;

a second level shift resistor coupling said second comparator input to the second variable power supply terminal;

a voltage level detector coupled between the second variable power supply terminal and the fixed supply terminal, having an input and an output, with said input coupled to the first variable power supply terminal;

a voltage translator coupled between the second variable power supply terminal and the fixed supply terminal, having a first input coupled to said second comparator output, a second input coupled to said voltage level detector output, and an output;

a first transistor switch having a first terminal coupled to a well terminal of an output transistor, a second terminal coupled to the first variable power supply terminal, and a gate terminal coupled to said comparator first output; and a second transistor switch having a first terminal coupled to the well terminal of the output transistor, a second terminal coupled to the second variable power supply terminal, and a gate terminal coupled to said voltage translator output.

6. The switching circuit of claim 5 wherein said comparator further comprises:

a CMOS differential pair input stage having two input transistors, two load transistors, and a current source transistor;

a biasing circuit coupled to said current source transistor for biasing said input stage; and an inverting output stage with an input coupled to an output of said differential pair input stage, and an output coupled to a plurality of inverter stages coupled in series.

7. The switching circuit of claim 5 wherein said voltage level detector further comprises:

an input inverter having an input coupled to the first variable power supply terminal, and an output;

a second inverter having an input coupled to said input inverter output, and an output; and a third inverter having an input coupled to said second inverter output, and an output coupled to said level detector output.

8. The switching circuit of claim 5 wherein said voltage translator further comprises:

a latch input stage having a first input transistor for receipt of said comparator second output, a second input transistor coupled in parallel to said first input transistor for receipt of said level detector output, a third transistor, and two cross-coupled load transistors;

a two-input logical gate for receipt of said comparator second output and said level detector output, having an output coupled to a gate of said latch input stage third transistor; and a first and a second inverter coupled in series having an input coupled to said latch input stage output, and an output coupled to said voltage translator output.

9. In a complementary metal-oxide-semiconductor (CMOS) circuit coupled between a first and a second variable power supply terminal and a fixed supply terminal, a switching circuit comprising:

a CMOS differential pair input stage coupled between the first variable power supply terminal and the fixed supply terminal, having a first and a second input transistor, two load transistors, and a current source transistor;

a first level shift resistor coupling an input of said first input transistor to the first variable power supply terminal;

a second level shift resistor coupling an input of said second input transistor to the second variable power supply terminal;

a biasing circuit coupled between the first variable power supply and the fixed supply, and coupled to said current source transistor for biasing said differential pair input stage;

an inverting output stage coupled between the first variable power supply and the fixed supply, with an input coupled to an output of said differential pair input stage;

a first plurality of inverters coupled between the first variable power supply terminal and the fixed supply terminal, and coupled in series having an input coupled to an output of said inverting output stage, and a first and a second output;

a second plurality of inverters coupled between the second variable power supply terminal and the fixed supply terminal, and coupled in series having an input coupled to the first variable power supply terminal, and an output;

a latch input stage coupled between the second variable power supply terminal and the fixed supply terminal, having a first latch input transistor for receipt of said second output of said first plurality of inverters, a second latch input transistor coupled in parallel to said first latch input transistor for receipt of said second plurality of inverters output, a third transistor, and two cross-coupled load transistors;

a two-input logical gate for receipt of said second output of said first plurality of inverters and said second plurality of inverters output, having an output coupled to a gate of said latch input stage third transistor;

a third plurality of inverters coupled between the second variable power supply terminal and the fixed supply terminal, coupled in series having an input coupled to said latch input stage output, and an output;

a first transistor switch having a first terminal coupled to a well terminal of an output transistor, a second terminal coupled to the first variable power supply terminal, and a gate terminal coupled to said first plurality of inverters first output; and a second transistor switch having a first terminal coupled to the well terminal of the output transistor, a second terminal coupled to the second variable power supply terminal, and a gate terminal coupled to said third plurality of inverters output.

* * * * *